(12) United States Patent
Ishiguro

(10) Patent No.: US 7,723,172 B2
(45) Date of Patent: May 25, 2010

(54) METHODS FOR MANUFACTURING A TRENCH TYPE SEMICONDUCTOR DEVICE HAVING A THERMALLY SENSITIVE REFILL MATERIAL

(75) Inventor: Takeshi Ishiguro, Fukushima-ken (JP)

(73) Assignee: Icemos Technology Ltd., Belfast (GB)

( * ) Notice: Subject to any disclaimer, the term of this patent is extended or adjusted under 35 U.S.C. 154(b) by 62 days.

(21) Appl. No.: 12/029,857

(22) Filed: Feb. 12, 2008

(65) Prior Publication Data
US 2008/0258226 A1 Oct. 23, 2008

Related U.S. Application Data

(60) Provisional application No. 60/913,425, filed on Apr. 23, 2007.

(51) Int. Cl.
*H01L 21/8238* (2006.01)
(52) U.S. Cl. .................. 438/207; 438/204; 438/418; 257/E21.042; 257/E21.546; 257/E21.375; 257/E21.373
(58) Field of Classification Search ................. 438/204, 438/206, 207, 209, 210, 418, 453; 257/E21.042, 257/E21.044, E21.375, E21.33, E21.259, 257/E21.26, E21.261, E21.263, E21.264, 257/E21.262, E21.628
See application file for complete search history.

(56) References Cited

U.S. PATENT DOCUMENTS

| | | |
|---|---|---|
| 3,404,295 A | 10/1968 | Warner, Jr. |
| 3,497,777 A | 2/1970 | Teszner |
| 3,564,356 A | 2/1971 | Wilson |
| 4,158,206 A | 6/1979 | Neilson |
| 4,211,582 A | 7/1980 | Horng et al. |
| 4,238,278 A | 12/1980 | Antipov |
| 4,491,486 A | 1/1985 | Iwai |
| 4,754,310 A | 6/1988 | Coe |
| 4,775,881 A | 10/1988 | Ploog et al. |
| 4,821,095 A | 4/1989 | Temple |
| 4,866,004 A | 9/1989 | Fukushima |
| 4,868,624 A | 9/1989 | Grung et al. |
| 4,895,810 A | 1/1990 | Meyer et al. |
| 4,994,406 A | 2/1991 | Vasquez et al. |
| 5,019,522 A | 5/1991 | Meyer et al. |

(Continued)

FOREIGN PATENT DOCUMENTS

JP 52-038889 A 3/1977

(Continued)

OTHER PUBLICATIONS

Chenming Hu; Optimum Doping Profile for minimum Ohmic Resistance and High-Breakdown Voltage; IEEE Transactions on Electron Devices, vol. ED-26, No. 3, pp. 243-244; Mar. 1979.

(Continued)

*Primary Examiner*—Caridad M Everhart
(74) *Attorney, Agent, or Firm*—Panitch Schwarze Belisario & Nadel LLP

(57) ABSTRACT

Methods for manufacturing trench type semiconductor devices containing thermally unstable refill materials are provided. A disposable material is used to fill the trenches and is subsequently replaced by a thermally sensitive refill material after the high temperature processes are performed. Trench type semiconductor devices manufactured according to method embodiments are also provided.

20 Claims, 3 Drawing Sheets

U.S. PATENT DOCUMENTS

| | | |
|---|---|---|
| 5,027,180 A | 6/1991 | Nishizawa et al. |
| 5,045,903 A | 9/1991 | Meyer et al. |
| 5,105,243 A | 4/1992 | Nakagawa et al. |
| 5,216,275 A | 6/1993 | Chen |
| 5,218,226 A | 6/1993 | Slatter et al. |
| 5,219,777 A | 6/1993 | Kang |
| 5,366,914 A | 11/1994 | Takahashi et al. |
| 5,389,815 A | 2/1995 | Takahashi |
| 5,395,790 A | 3/1995 | Lur |
| 5,418,376 A | 5/1995 | Muraoka et al. |
| 5,430,311 A | 7/1995 | Murakami et al. |
| 5,432,113 A | 7/1995 | Tani |
| 5,435,888 A | 7/1995 | Kalnitsky et al. |
| 5,438,215 A | 8/1995 | Tihanyi |
| 5,472,888 A | 12/1995 | Kinzer |
| 5,506,421 A | 4/1996 | Palmour |
| 5,510,287 A | 4/1996 | Chen et al. |
| 5,519,245 A | 5/1996 | Tokura et al. |
| 5,572,048 A | 11/1996 | Sugawara |
| 5,598,018 A | 1/1997 | Lidow et al. |
| 5,726,469 A | 3/1998 | Chen |
| 5,742,087 A | 4/1998 | Lidow et al. |
| 5,744,994 A | 4/1998 | Williams |
| 5,786,619 A | 7/1998 | Kinzer |
| 5,902,127 A | 5/1999 | Park |
| 5,926,713 A | 7/1999 | Hause et al. |
| 5,929,690 A | 7/1999 | Williams |
| 5,939,754 A | 8/1999 | Hoshi |
| 5,998,292 A | 12/1999 | Black et al. |
| 6,008,106 A | 12/1999 | Tu et al. |
| 6,011,298 A | 1/2000 | Blanchard |
| 6,066,878 A | 5/2000 | Neilson |
| 6,081,009 A | 6/2000 | Neilson |
| 6,174,773 B1 | 1/2001 | Fujishima |
| 6,184,555 B1 | 2/2001 | Tihanyi et al. |
| 6,190,970 B1 | 2/2001 | Liao et al. |
| 6,198,127 B1 | 3/2001 | Kocon |
| 6,214,698 B1 | 4/2001 | Liaw et al. |
| 6,222,229 B1 | 4/2001 | Hebert et al. |
| 6,239,463 B1 | 5/2001 | Williams et al. |
| 6,265,281 B1 | 7/2001 | Reinberg |
| 6,291,856 B1 | 9/2001 | Miyasaka et al. |
| 6,300,171 B1 | 10/2001 | Frisina |
| 6,307,246 B1 | 10/2001 | Nitta et al. |
| 6,310,365 B1 | 10/2001 | Chen |
| 6,359,309 B1 | 3/2002 | Liao et al. |
| 6,362,505 B1 | 3/2002 | Tihanyi |
| 6,391,723 B1 | 5/2002 | Frisina |
| 6,406,975 B1 | 6/2002 | Lim et al. |
| 6,410,958 B1 | 6/2002 | Usui et al. |
| 6,426,991 B1 | 7/2002 | Mattson et al. |
| 6,452,230 B1 | 9/2002 | Boden, Jr. |
| 6,459,124 B1 | 10/2002 | Zhang et al. |
| 6,465,325 B2 | 10/2002 | Ridley et al. |
| 6,495,421 B2 | 12/2002 | Luo |
| 6,501,130 B2 | 12/2002 | Disney |
| 6,501,146 B1 | 12/2002 | Harada |
| 6,504,230 B2 | 1/2003 | Deboy et al. |
| 6,509,220 B2 | 1/2003 | Disney |
| 6,512,267 B2 | 1/2003 | Kinzer et al. |
| 6,534,367 B2 | 3/2003 | Peake et al. |
| 6,566,201 B1 | 5/2003 | Blanchard |
| 6,613,644 B2 | 9/2003 | Lachner |
| 6,624,494 B2 | 9/2003 | Blanchard et al. |
| 6,635,906 B1 | 10/2003 | Chen |
| 6,686,244 B2 | 2/2004 | Blanchard |
| 6,710,400 B2 | 3/2004 | Blanchard |
| 6,710,403 B2 | 3/2004 | Sapp |
| 6,710,418 B1 | 3/2004 | Sapp |
| 6,713,813 B2 | 3/2004 | Marchant |
| 6,762,473 B1 | 7/2004 | Goushcha et al. |
| 6,787,872 B2 | 9/2004 | Kinzer |
| 6,797,589 B2 | 9/2004 | Adams et al. |
| 6,936,867 B2 | 8/2005 | Chen |
| 6,936,907 B2 | 8/2005 | Chen |
| 6,998,681 B2 | 2/2006 | Chen |
| 7,015,104 B1 | 3/2006 | Blanchard |
| 7,023,069 B2 | 4/2006 | Blanchard |
| 7,041,560 B2 | 5/2006 | Hshieh |
| 7,052,982 B2 | 5/2006 | Hshieh et al. |
| 7,109,110 B2 | 9/2006 | Hsieh |
| 2002/0070418 A1 | 6/2002 | Kinzer et al. |
| 2005/0176192 A1 | 8/2005 | Hshieh |
| 2005/0181564 A1 | 8/2005 | Hshieh et al. |
| 2005/0215027 A1 | 9/2005 | Williams et al. |
| 2006/0163690 A1* | 7/2006 | Blanchard .................. 257/510 |
| 2006/0205174 A1* | 9/2006 | Hshieh et al. ............... 438/435 |

FOREIGN PATENT DOCUMENTS

| | | |
|---|---|---|
| WO | 2005001941 A3 | 1/2005 |
| WO | 2005031880 A1 | 4/2005 |

OTHER PUBLICATIONS

P. Rossel; Power M.O.S. Devices; Microelectron, Reliab., vol. 24, No. 2, pp. 339-366; 1984.

Victor A.K. Temple et al.; A 600-Volt MOSFET Designed for Low On-Resistance; IEEE Transactions on Electron Devices, vol. ED-27, No. 2, pp. 343-349; Feb. 1980.

Xing-Bi Chen et al.; Optimum Doping Profile of Power MOSFET; IEEE Transactions on Electron Devices, vol. ED-29, No. 6, pp. 985-987; Jun. 1982.

U.S. Appl. No. 11/962,523, Takeshi Ishiguro.
U.S. Appl. No. 12/031,895, Takeshi Ishiguro.
U.S. Appl. No. 11/962,530, Takeshi Ishiguro.
U.S. Appl. No. 12/031,909, Takeshi Ishiguro.

* cited by examiner

METHODS FOR MANUFACTURING A TRENCH TYPE SEMICONDUCTOR DEVICE HAVING A THERMALLY SENSITIVE REFILL MATERIAL

CROSS REFERENCE TO RELATED APPLICATIONS

This application claims priority to U.S. Provisional Patent Application No. 60/913,425, filed on Apr. 23, 2007, entitled "Methods for Manufacturing a Trench Type Semiconductor Device Having A Thermally Sensitive Refill Material."

BACKGROUND OF THE INVENTION

Embodiments of the present invention relate to a semiconductor device and a method for manufacturing a semiconductor device. In particular, embodiments of the present invention relate to methods for manufacturing a trench type semiconductor device having a thermally sensitive refill material.

Since the invention of superjunction devices by Dr. Xingbi Chen, as disclosed in U.S. Pat. No. 5,216,275, the contents of which are incorporated by reference herein, there have been many attempts to expand and improve on the superjunction effect of his invention. U.S. Pat. Nos. 6,410,958, 6,300,171 and 6,307,246 are examples of such efforts and are incorporated herein by reference.

Trench type superjunction devices are expected to replace multi-epi superjunction device because of the potential lower process cost. To manufacture a trench type superjunction device, insulator material is required to refill one or more of the etched trenches. The refill material should be selected carefully because the material impacts the electrical characteristics and reliability of the superjunction device. Generally, thermally stable materials, such as epitaxy, Tetraethylorthosilicate (TEOS), polysilicon, or semi-insulating polysilicon have been used as the refill material.

Organic materials, which have low thermal expansion and provide good coverage, such as polyimide, are desirable candidates for the refill material. The melted organic refill materials generally have lower viscosity. Thus, internal voids in the refill material are less likely to occur during the refill process as compared to the conventional inorganic refill materials. In addition, the trenches can be filled with an organic refill material using technically less demanding methods, such as surface reflow methods. Furthermore, devices having organic refill materials are expected to have more stable surface potential at the breakdown voltage. Despite these advantages, thermally sensitive organic materials have not traditionally been used as a refill material for a trench type superjunction device because they are thermally unstable at a temperature significantly lower than the temperature used in the semiconductor diffusion processes employed in a conventional manufacturing method.

Therefore, it is desirable to provide a method for manufacturing a trench type semiconductor device having thermally sensitive refill materials and a trench type semiconductor device having thermally sensitive refill materials.

BRIEF SUMMARY OF THE INVENTION

In one general aspect, in a method provided by an embodiment of the present invention, a disposable material is used to fill the trenches and is subsequently replaced by a thermally sensitive refill material after high temperature processes, i.e., those involved in the formation of a terminal structure, are performed.

A semiconductor substrate having first and second main surfaces opposite to each other is provided. The semiconductor substrate has a heavily doped region of a first conductivity type at the second main surface and has a second region of the first conductivity type at the first main surface. A plurality of trenches and a plurality of mesas are formed in the semiconductor substrate, with each mesa having an adjoining trench and a first extending portion extending from the first main surface toward the heavily doped region to a first depth position. At least one mesa has a first sidewall surface and a second sidewall surface. Each of the plurality of trenches has a bottom. The method further includes doping, with a dopant of a second conductivity type, the first sidewall surface of the at least one mesa to form a first doped region of the second conductivity type and doping, with a dopant of a second conductivity type, the second sidewall surface of the at least one mesa to form a second doped region of the second conductivity type. After the doping steps, at least a portion of the plurality of trenches is filled near the surface with a disposable material. A terminal structure is formed at the first main surface side. The method further includes removing the disposable material from the plurality of trenches and filling the plurality of trenches with a semi-insulating material and/or an insulating material, or a combination thereof, that is thermally unstable at a temperature of about 800° C. and above. In particular embodiments, the semi-insulating material and/or an insulating material, or combination thereof, is thermally unstable at a temperature of about 450° C. and above.

In another general aspect, an embodiment of the present invention includes a trench type semiconductor device that is made by a method according to embodiments of the present invention.

In particular embodiments, the semi-insulating material and/or the insulating material used in the methods or the devices of the embodiments of the invention is an organic material.

Other aspects, features and advantages will be apparent from the following disclosure, including the detailed description, preferred embodiments, and the appended claims.

BRIEF DESCRIPTION OF SEVERAL VIEWS OF THE DRAWINGS

The foregoing summary, as well as the following detailed description of preferred embodiments of the invention, will be better understood when read in conjunction with the appended drawings. For purposes of illustrating the invention, there are shown in the drawings embodiments which are presently preferred. It should be understood, however, that the invention is not limited to the precise arrangements and instrumentalities shown.

In the drawings.

DETAILED DESCRIPTION OF THE INVENTION

Figure 1:
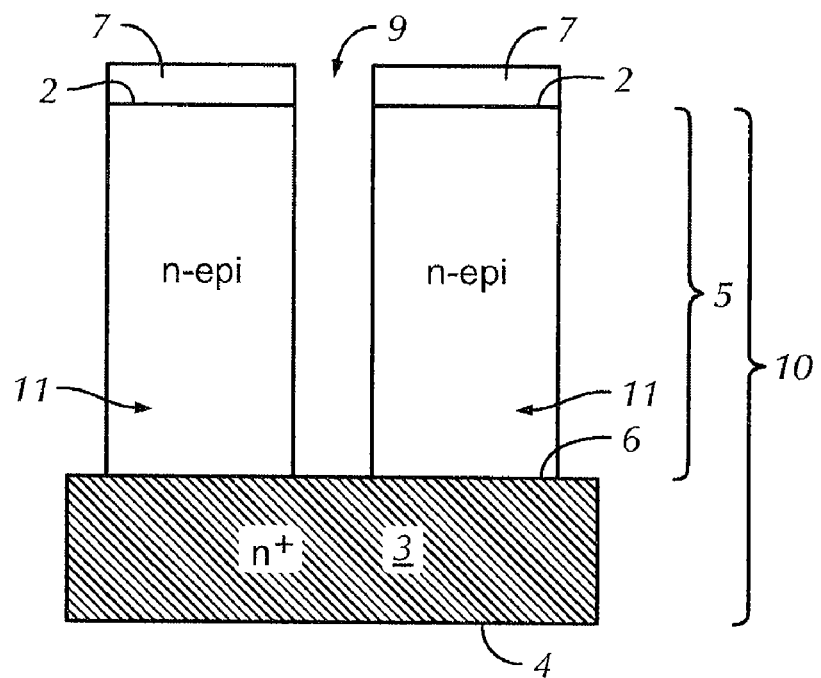
FIG. 1 is an enlarged partial cross-sectional view of a semiconductor substrate after oxidation and trench etching.

For simplicity and clarity of illustration, elements in the figures are not necessarily to scale, and the same reference numbers in different figures denote the same elements. For clarity of the drawing, devices, trenches, mesas, and the doped regions of device structures are illustrated as having generally straight line edges and precise angular corners. However, those skilled in the art understand that the edges need not be straight lines and the corners need not be precise angles.

Various publications, articles and patents are cited or described in the background and throughout the specification; each of these references is herein incorporated by reference in its entirety. Discussion of documents, acts, materials, devices, articles or the like which has been included in the present specification is for the purpose of providing context for embodiments of the present invention. Such discussion is not an admission that any or all of these matters form part of the prior art with respect to any inventions disclosed or claimed.

Unless defined otherwise, all technical and scientific terms used herein have the same meaning as commonly understood to one of ordinary skill in the art to which this invention pertains. In this application, certain terms are used frequently, which shall have the meanings as set forth as follows. These terms may also be explained in greater detail later in the specification.

Certain terminology is used in the following description for convenience only and is not limiting. The words "right", "left", "lower", and "upper" designate directions in the drawing to which reference is made. The words "inwardly" and "outwardly" refer direction toward and away from, respectively, the geometric center of the object described and designated parts thereof. The terminology includes the words above specifically mentioned, derivatives thereof and words of similar import. Additionally, it must be noted that as used herein and in the appended claims, the singular forms "a," "an," and "the" include plural reference unless the context clearly dictates otherwise.

Although any embodiment of the present invention may refer to a particular conductivity (e.g., p-type or n-type), it will be readily understood by those skilled in the art that p-type conductivity can be switched with n-type conductivity and vice versa and the device will still be functionally correct (i.e., a first or second conductivity type). For example, metal oxide semiconductor field effect transistor (MOSFET)-gated devices and insulated gate bipolar transistors (IGBTs) can be fabricated in an epitaxial wafer with an n-type epitaxial layer over a $p^+$ substrate (or vice versa).

An n-type semiconductor includes any semiconductor obtained by n-type doping process, i.e., by adding an impurity (dopant) to a semiconductor, in order to increase the number of free electrons in the material. For example, an n-type semiconductor can be obtained by incorporating phosphorus (P), arsenic (As), or antimony (Sb), into silicon. The n-type semiconductor can be heavily doped ($n^+$), very heavily doped ($n^{++}$), lightly doped ($n^-$), or very lightly doped ($n^{--}$). The level of doping of the n-type semiconductor is directly proportional to the carrier concentration.

A p-type semiconductor includes any semiconductor obtained by p-type doping process, i.e., by adding an impurity (dopant) to a semiconductor, in order to increase the number of free holes in the material. For example, a p-type semiconductor can be obtained by incorporating boron (B) or aluminum (Al) into silicon. The p-type semiconductor can be heavily doped ($p^+$), very heavily doped ($p^{++}$), lightly doped ($p^-$), or very lightly doped ($p^{--}$). The level of doping of the p-type semiconductor is directly proportional to the carrier concentration.

Doping in accordance with various embodiments of the present invention can be carried out using any method or equipment known or to be developed for imparting impurities of either n-type or p-type into another material, including, for example, ion implantation and in-situ vapor deposition techniques.

As used herein, an "organic material" refers to a material comprising an organic compound. An organic compound can be any member of a large class of chemical compounds the molecules of which contain carbon and hydrogen. An organic compound may also contain any number of other elements, such as nitrogen, oxygen, halogens, phosphorous, sulfur, etc.

As used herein, a material is "thermally unstable" or "thermally sensitive" when a physical property of the material is changed under the influence of heat. The change in physical property of the material under the influence of heat can be, for example, melting, boiling, sublimating, or decomposing. An organic compound typically becomes thermally unstable at a temperature much lower than the temperature at which an inorganic compound becomes thermally unstable.

As used herein, the term "terminal structure" refers to a structure that contains any one or more of the structures involved in a terminal for a semiconductor device. The "terminal structure" can be, for example, an electrode that is connected to the semiconductor device, such as a gate electrode, a source electrode, or a drain electrode. The "terminal structure" can also be, for example, a doped region in the semiconductor substrate that is in close proximity or adjacent to an electrode connected to the semiconductor device. Examples of such doped regions, include, but are not limited to, a body region, a body contact region, and a source region. The "terminal structure" can be a combination of any one or more of the electrodes and the doped regions. In one embodiment of the present invention, the "terminal structure" comprises a gate electrode, a body region, a body contact region, a source region and a source electrode.

The device according to embodiments of the present invention can embody either a cellular design (where the body regions are a plurality of cellular regions) or a single body design (where the body region includes a single region formed in an elongated pattern, typically in a serpentine pattern). Although the device will be described as a cellular design throughout the following description for ease of understanding, it should be understood that it is intended that embodiments of the present invention encompass a cellular design, a single body design, or combinations thereof. By way of example, a device according to embodiments of the present invention is among many such devices integrated with logic and/or other components into a semiconductor chip as part of a power integrated circuit. Alternatively, a device according to embodiments of the present invention is among many such devices integrated together to form a discrete transistor device.

In a conventional manufacturing process for a trench type superjunction device, the trenches are generally refilled before several high temperature steps. For example, the trenches are generally filled before forming a terminal structure, which may involve processes performed at about 800-1200° C., including, but not limited to, gate electrode formation, body p diffusion, body contact p diffusion, and source n diffusion. Prior art refill materials used to fill the trenches prior to the high temperature processes were therefore required to be thermally stable at about 800-1200° C. However, most of the usable organic materials are thermally unstable at a temperature of about 300 to about 800° C. and above. Thus, such organic material cannot be used as refill material in the conventional or prior art processes.

Thermally sensitive materials, including organic materials, can be used as the refill material in a method that involves at least partially forming a terminal structure prior to forming the trenches, doping the trenches, and refilling the trenches, as described in co-pending U.S. patent application Ser. No. 11/962,523. However, to maintain the desired shallowness of the body contact and the source regions in the terminal structure, doping at the sidewall surfaces of the trenches cannot be performed at high temperatures for an extended duration. This limits the width of the doped regions at the sidewall surfaces of the trenches, thus limiting the choices for the width of p and n columns in the superjunction devices.

In a method according to a preferred embodiment, a disposable material is used to temporarily fill the trenches and is subsequently replaced by a thermally sensitive refill material after high temperature processes, e.g., those involved in the formation of a terminal structure, are performed. According to certain preferred embodiments, the steps of forming the trenches and doping the trenches are performed before the step of forming the terminal structure. High temperatures and long time periods may be used in doping the trenches because they will have no impact on the structural integrity of the terminal structure. Therefore, the sidewall surfaces of the trenches can be doped as shallowly or as deeply as desired, which provides more flexibility in choosing the structure of the alternating p and n columns in a trench type superjunction device.

Referring to FIG. 1, which is an enlarged partial cross-sectional view of a semiconductor substrate 10 after oxidation and trench etching in accordance with preferred embodiments, the semiconductor substrate 10 has two main surfaces 2 and 4 opposite to each other. The semiconductor substrate 10 includes a substrate region 3 including surface 4 and a semiconductor material layer 5 including surface 2. Semiconductor substrate materials suitable for use in the device embodiments of the present invention include, but are not limited to, various semiconducting materials such as silicon, germanium, arsenides, antimonides and/or phosphides of gallium and/or indium, and combinations thereof.

In various embodiments, the semiconductor substrate 10 can comprise a silicon wafer. Silicon wafers can be prepared via standard techniques. For example, suitable wafers may be prepared via a process wherein silicon is grown from a small crystal, called the seed crystal, rotated and slowly withdrawn from molten hyper-pure silicon to give a cylindrical crystal, which is then sliced to obtain thin disks, which after slicing, are finely ground, mirror-smooth polished and cleaned. Silicon wafers suitable for use in various embodiments of the present invention can be undoped, or doped with either p-type or n-type conductivity, either heavily or lightly.

In certain preferred embodiments, the substrate region 3 and the semiconductor material layer 5 are both doped with a dopant of the same conductivity type. Generally, in such preferred embodiments, the substrate region 3 is doped at a level greater than the semiconductor material layer 5. For example, in embodiments wherein the substrate region 3 comprises a silicon wafer doped with n-type conductivity and the semiconductor material layer 5 comprises epitaxial silicon which is lightly n-type doped, the level of doping in the substrate region can be about $1 \times 10^{17}$ cm$^{-3}$ to about $1 \times 10^{20}$ cm$^{-3}$, and the level of doping in the semiconductor material layer 5 can be about $7 \times 10^{13}$ cm$^{-3}$ to about $5 \times 10^{15}$ cm$^{-3}$.

In certain preferred embodiments, the semiconductor material layer 5 may be epitaxial silicon, which refers to single crystal silicon grown over a substrate, usually via chemical vapor deposition (CVD). Epitaxially grown silicon deposited using CVD can be doped during formation with a high degree of control. Accordingly, lightly doped silicon 5 can be deposited over a silicon substrate 3. In certain embodiments, the semiconductor layer 5 comprises epitaxial silicon doped with a dopant of a first conductivity, as shown in FIG. 1, n-type conductivity, at a level of about $7 \times 10^{13}$ cm$^{-3}$ to about $5 \times 10^{15}$ cm$^{-3}$. In certain preferred embodiments according to the present invention, the semiconductor layer 5 may be epitaxial silicon doped with n-type conductivity at a level of about $1 \times 10^{14}$ cm$^{-3}$ to about $2 \times 10^{14}$ cm$^{-3}$. Any suitable epitaxial deposition apparatus known or to be developed can be used to form an epitaxial semiconductor material layer suitable for use in the embodiments of the present invention. The thickness of layer 5 is increased or decreased depending on the desired breakdown voltage rating of the device. Devices with higher desired breakdown voltage require thicker epitaxial layer. In an exemplary embodiment, for a device having about 600 V breakdown voltage, layer 5 has a thickness on the order of about 40-50 microns.

An oxide layer 7 is either grown or deposited on the top surface of the epitaxial layer 5. The oxide layer 7 is thick enough to protect the top surface 2 during trench etching. In an exemplary embodiment, the oxide layer 7 comprises silicon oxide, and has a thickness of about 0.5 microns to about 1 microns. In alternative embodiments, the oxide layer 7 comprises silicon nitride, tantalum pentoxide, titanium dioxide, barium strontium titanate, or combinations thereof including combinations with silicon oxide, or any materials that have good etching selectivity.

One or more trenches 9 are formed in layer 5 extending from main surface 2 to touch, approach, or penetrate an interface 6 between the heavily doped n$^+$ region 3 and the epitaxial layer 5. Note however, trenches 9 are not required to touch or to approach the interface 6. Trenches 9 can be formed in layer 5 extending from the main surface 2 to any desired depth position, including penetrating layer 5 and reaching into substrate 3. Each of the trenches 9 is adjacent to an adjoining mesa 11. Many geometrical arrangements of trenches 9 and mesas 11 (i.e., in plan view) are contemplated without departing from the invention. The shape of the trench is not limited to being rectangular. Many other possible trench shapes such as dog-bones, rectangles with rounded ends, or crosses are also possible. The number and locations of the trenches may affect overall device efficiency.

Preferably, the trenches 9 are formed by utilizing known techniques such as plasma etching, reactive ion etching (RIE), sputter etching, vapor phase etching, chemical etching, deep RIE or the like. Utilizing deep RIE, trenches 9 can be formed having depths of about 40 μm to about 300 μm or even deeper. Deep RIE technology permits deeper trenches 9 with straighter sidewalls. Furthermore, forming deeper trenches 9 that have straighter sidewalls than conventionally etched or formed trenches 9, in addition to other steps in the process, results in a final superjunction device with enhanced avalanche breakdown voltage ($V_b$) characteristics as compared to conventional semiconductor-transistor devices (i.e., the avalanche breakdown voltage ($V_b$) can be increased to about 200 to 1200 Volts or more).

The sidewalls of each trench 9 can be smoothed, if needed, using, for example, one or more of the following process steps: (i) an isotropic plasma etch may be used to remove a thin layer of silicon (typically 100-1000 Angstroms) from the trench surfaces or (ii) a sacrificial silicon dioxide layer may be grown on the surfaces of the trench and then removed using an etch such as a buffered oxide etch or a diluted hydrofluoric (HF) acid etch. The use of the smoothing techniques can produce smooth trench surfaces with rounded corners while removing residual stress and unwanted contaminates. However, in the embodiments where it is desirable to have vertical sidewalls and square corners, an anisotropic etch process is ideally used instead of the isotropic etch process discussed above. Anisotropic etching, in contrast to isotropic etching, generally means different etch rates in different directions in the material being etched.

Figure 2:
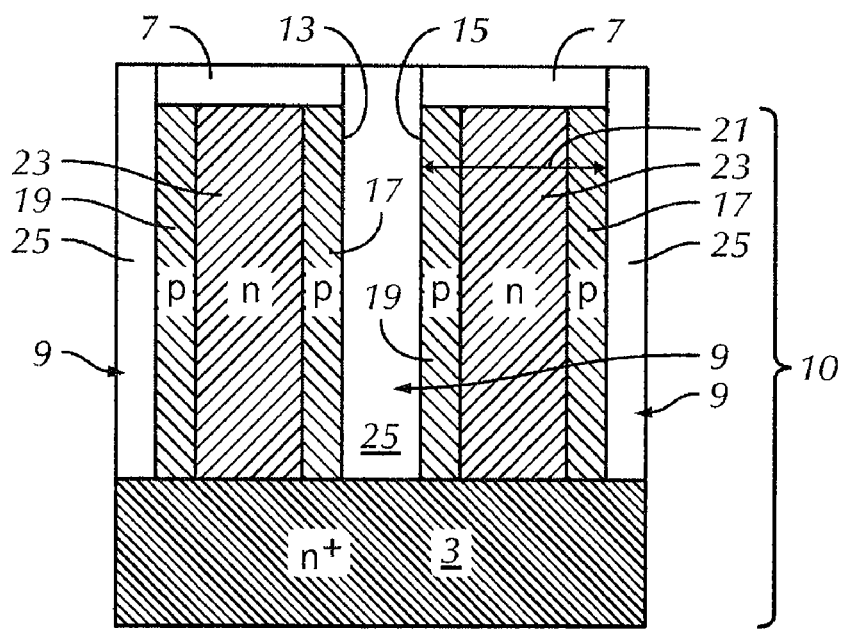
FIG. 2 is an enlarged partial cross-sectional view of the semiconductor substrate after doping of the sidewall surfaces of the trenches and refilling the trenches with a disposable material.

FIG. 2 is an enlarged partial cross-sectional view of the semiconductor substrate 10 after doping of the sidewall surfaces of the trenches and refilling the trenches with a disposable material. A first sidewall surface 13 and a second sidewall surface 15 of trench 9 in about parallel alignment with each other are implanted or doped with a p dopant such as boron (P) using any techniques known in the art. Preferably, the implants are performed without benefits of a masking step, e.g., at a implantation angle Φ (not shown) determined by the width and the depth of the trenches 9, at a high energy level in the range of about 40 Kilo-electron-volts (KeV) to several Mega-eV. Preferably, the energy level is in the range of about 200 KeV to 1 MeV, but it should be recognized that the energy level should be selected to sufficiently implant the dopant. The use of the predetermined implantation angle Φ ensures that only the sidewalls 13, 15 of the trenches 9 and not the bottoms of the trenches 9 are implanted. The implantation angle Φ can be between about 2° and 12° from vertical and is preferably about 4°.

In certain preferred embodiments the trenches 9 are preferably slightly wider at the top by about 1%-10% than at the bottom to facilitate the trench fill process when the trenches 9, for example, are to be filled with grown oxide. Consequently, the trenches 9 have a first sidewall surface 13 with a predetermined inclination maintained relative to the first main surface 2 and a second sidewall surface 15 with a predetermined inclination maintained relative to the first main surface 2. The inclination of the first sidewall surface 13 is about the same as the inclination of the second sidewall surface 15 depending on tolerances of the etching process. Other doping techniques may also be utilized.

Following implanting the p-type implant on both sidewall surfaces 13, 15, a drive-in step (i.e., a diffusion) is performed using any known techniques to create p-type doped regions 17, 19. Preferably, a temperature and a time period for the drive-in step are selected to sufficiently drive in the implanted dopant into the mesas 11. In an exemplary embodiment, the drive-in step is performed at a temperature of up to about 1200° C. for up to about 24 hours. After the drive-in step, the mesas 11 adjacent to two trenches 9 are converted to pnp columns 21, each comprising the p columns 17 and 19 and the n columns 23. The n columns 23 have the same carrier concentration as that of layer 5.

In another exemplary embodiment (not shown in FIG. 2), after the step of trench etching, the sidewall surfaces of the trenches 13, 15 are doped with an n-type dopant at a carrier concentration higher than that of layer 5 using a method similar to that described above. A diffusion step is performed at about 1150-1200° C. for about 15-20 hours. The sidewall surfaces of the trenches 13, 15 are further doped with a p-type dopant, followed by a diffusion step performed at about 1150-1200° C. for about 1-2 hours. According to this embodiment, the n portion in the pnp column 21 has higher carrier concentration than the carrier concentration in the epitaxial layer 5.

An oxidation step, usually performed in a steam or oxygen ambient, can also be performed with or subsequent to the drive-in step, which forms a silicon dioxide layer (not shown) on the sidewalls 13, 15 and the bottoms of the trenches 9. A thin layer of silicon nitride (not shown) can also be deposited on the sidewalls 13, 15 and the bottoms of the trenches 9. Deposition of silicon nitride on thermally oxidized silicon wafers does not influence the fundamental properties of the Si—$SiO_2$ interface. The existence of silicon nitride makes surface potential stable or unstable according to the structures, partly due to the existence of hydrogen in silicon nitride. Hydrogen can influence electric properties. The layer of silicon nitride also serves the function to isolate and protect the silicon and silicon oxide in the pnp columns 21 from the refill material to be filled in trenches 9.

The lining of the trenches 9 with silicon nitride can be performed in general by CVD (thermal or plasma). The lining of the trenches 9 with silicon dioxide can be performed in general by CVD (thermal, plasma, or spun-on-glass (SOG)). The lining of the trenches 9 with silicon dioxide and/or silicon nitride can preferably be performed using application of tetraethylorthosilicate (TEOS) because of the better conformity achieved by TEOS. Preferably, the silicon nitride is about 100 Å to about 10,000 Å thick (1 μm=10,000 Å).

After dopant implantation and diffusion to form the doped columns and the lining of the trenches 9, the trenches 9 are temporarily filled with a disposable material 25 at least in a portion of the trenches 9 adjacent the first main surface 2 ("top portion"). In one exemplary embodiment, the trenches 9 are capped or sealed with the disposable material 25 at the top portion. In another exemplary embodiment, the trenches 9 are entirely filled with the disposable material 25.

The disposable material 25 can be any suitable material that is thermally stable at a temperature of about 800° C. and above. Preferably, the disposable material is a material distinct from silicon so that a selective etching process can be used subsequently to remove the disposable material without affecting the rest of the silicon substrate.

Materials suitable for use as the disposable material 25 in accordance with preferred embodiments include, but are not limited to, silica and silicate-based compounds, epitaxy, TEOS, polysilicon, or semi-insulating polysilicon. Suitable silica and silicate compounds include materials having an $Si_xO_y$ formula, and in various preferred embodiments, include $SiO_2$.

In one embodiment, the trenches 9 or at least the top portion of the trenches 9 are filled with a disposable material 25 via a spinning sol-gel technique. Any silica, silicate, or other material capable of being prepared as stable suspension of colloidal particles (i.e., a sol) and which can undergo a sol-gel transition could be applied to the trenches 9 via a spin-on method. A suitable spin-on glass method which can be used in accordance with various embodiments includes the application of a film or thin coating of a sol disposable filling material. The sol disposable material can be applied to a surface of an article which has been placed on a spinning mechanism. The surface is preferably cleaned prior to application, and the sol disposable material is applied dropwise onto the center (i.e., spinning axis) of the surface. The article is rotated at a speed of about a few thousand rpm. The thickness of the resulting film is generally a function of the amount of material applied to the surface, the viscosity of the material, and rotational speed of the spin.

As the sol disposable material contacts the surface, the centrifugal spinning force spreads the sol across the surface in a substantially even manner and the sol undergoes a transition to a gel. While not being bound to any particular theory of molecular interaction, it is believed that a combination of the centrifugal force, material viscosity, and/or surface tension permits the formation of a gel over the openings of the trenches 9 and thus fills the entire trenches 9 or seals at least the top portion of the trenches 9 in accordance with various embodiments of the present invention.

Disposable materials capable of use in accordance with preferred embodiments can also be applied via deposition methods. A suitable deposition technique can include, for example, silica deposition via atmospheric pressure chemical vapor deposition (APCVD). Another suitable deposition technique is plasma-enhanced chemical vapor deposition (PECVD).

Figure 3:
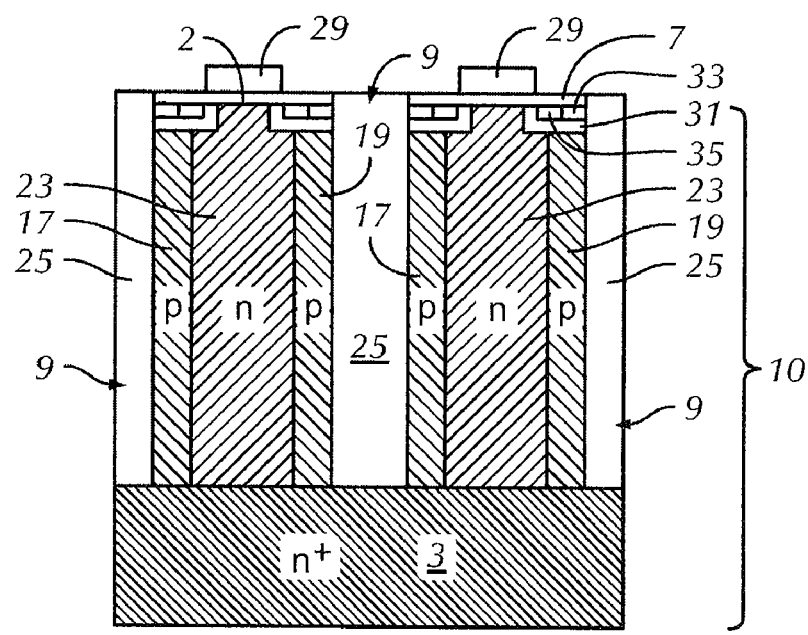
FIG. 3 is an enlarged partial cross-sectional view of the semiconductor substrate after a terminal structure is formed for a superjunction metal-oxide-semiconductor field-effect transistor (MOSFET) device.

FIG. 3 is an enlarged partial cross-sectional view of the semiconductor substrate 10 after a terminal structure is formed for a superjunction metal-oxide-semiconductor field-effect transistor (MOSFET) device. A body or doped region 31 is formed at the first main surface 2 in column p 17 or 19 and a portion of column n 23. In an exemplary embodiment, body region 31 is of p-type conductivity, having a dopant concentration suitable for forming an inversion layer that operates as conduction channels of the device. The body region 31 extends from main surface 2 to a depth of about 1.0 to about 5.0 microns. An n-type source region 33 is formed within or in the body region 31 and extends from the main surface 2 to a depth of about 0.2 microns to about 0.5 microns. A p-type body contact or contact region 35 is also formed in the body region 31, and provides a lower contact resistance to the body region 31 at the main surface 2. In exemplary embodiments, to form the body region p 31, the body contact 35, or the source 33, p-type dopant or n-type dopant is ion implanted into pnp columns 21 through the oxide layer 7 at an energy level of about 30-1000 KeV with a dose range from about $1 \times 10^{10}$ to $1 \times 10^{16}$ atoms cm$^{-2}$, preferably from about $1 \times 10^{14}$ to $1 \times 10^{16}$ atoms cm$^{-2}$, followed by a high temperature drive-in step (i.e., a diffusion).

A gate electrode 29 is formed over the oxide layer 7 using techniques known in the field. The gate electrode 29 may be composed of, for example, a metal, a doped polysilicon, an amorphous silicon, or a combination thereof. In a preferred embodiment, the gate electrode 29 is formed before the formation of the three doped regions: p body region 31, n source region 33, and the p body contact 35. Self-alignment technique is used to precisely align the three doped regions 31, 33, 35 with the gate electrode 29. In another embodiment, the gate electrode 29 is formed after the formation of the three doped regions 31, 33, 35.

Figure 4:
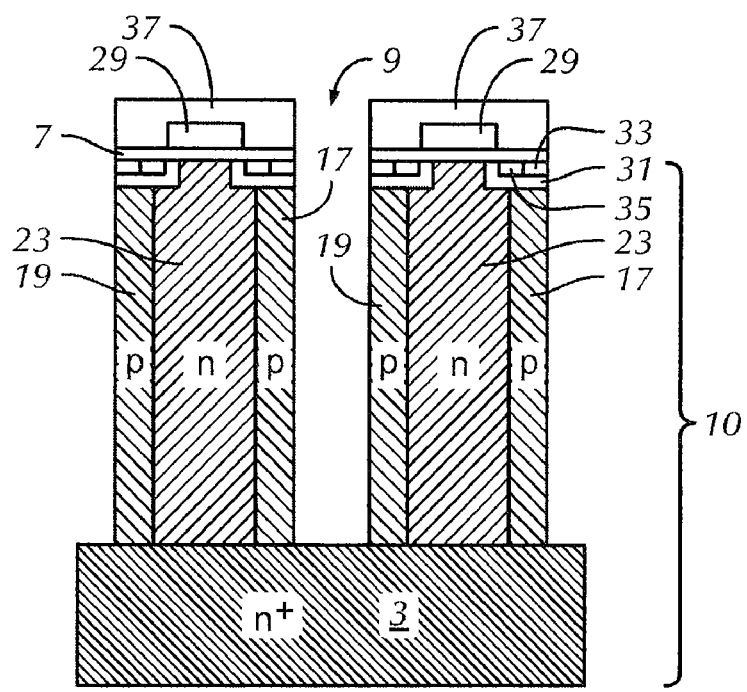
FIG. 4 is an enlarged partial cross-sectional view of the semiconductor substrate after interlayer dielectric (ILD) deposition and removing of the disposable refill material.

FIG. 4 is an enlarged partial cross-sectional view of the semiconductor substrate 10 after interlayer dielectric (ILD) deposition and removing of the disposable refill material. An ILD deposition 37 is deposited over the gate electrode 29 and the oxide layer 7 at the main surface 2. In an exemplary embodiment, the ILD layer 37 is a deposited silicon oxide about 0.5 to about 1.5 microns in thickness. ILD etching is then performed to remove the ILD deposition over the trenches 9.

The disposable material 25 within the trenches 9 is removed by methods known in the field. In an exemplary embodiment, the disposable material 25 is removed by an isotropic etching, a non-directional removal of material from a substrate via a chemical process using an etchant substance. The etchant can be a corrosive liquid or a plasma. Preferably, the etchant has high etching selectivity between the refill material 25 and the silicon.

Figure 5:
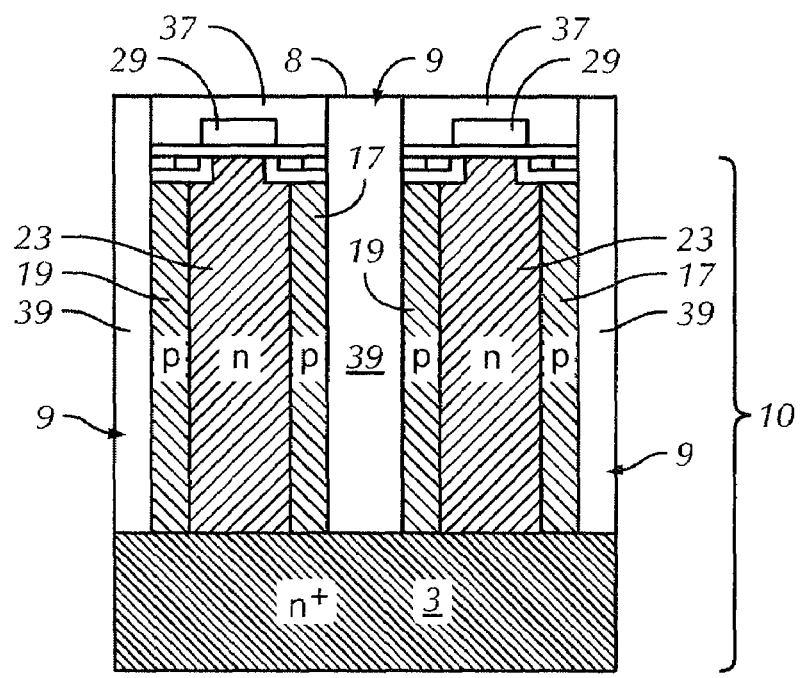
FIG. 5 is an enlarged partial cross-sectional view of the semiconductor substrate after refilling the trenches with a material such as a semi-insulating material, an insulating material, or a combination thereof.

After the disposable material 25 is removed from the trenches 9, the trenches are refilled with a material 39 (FIG. 5) such as a semi-insulating material, an insulating material, or a combination thereof. Because no process at a temperature over 800° C. will be performed after trench refill, materials that are thermally stable or unstable at a temperature of 800° C. and above can be used as the refill materials. Thermal processes, such as CVD, metal sputtering and metal sintering, can be performed after the implantation and diffusion steps in FIG. 3. These thermal processes are in general performed at a temperature of about 350-400° C. In some particular cases, such as the "hot aluminum" process to fulfill the contact hole, a temperature up to 500° C. can be involved. Therefore, the refill materials are preferably thermally stable at a temperature of about 350° C. and above. In exemplary embodiments of the present invention, the refill material can be thermally unstable at a temperature of about 800° C. and above, but preferably thermally stable at a temperature of about 350° C., about 400° C., about 450° C., about 500° C., about 550° C., about 600° C., about 650° C., about 700° C., or about 750° C.

In one embodiment, a thermally unstable organic material, such as a polyimide, other polymer resins, or a combination thereof, is used to refill the trenches 9 using a method of surface reflow or other methods known in the art. A polyimide (PI) is a linear or branched polymer of imide monomers. The glass transition temperature of a polyimide can be higher than 400° C. It has been used for passivation film or metal-metal interlayer for semiconductor devices.

Once the trenches 9 are filled, chemical mechanical polishing (CMP) or other techniques known in the art are performed to planarize the surface 8.

Figure 6:
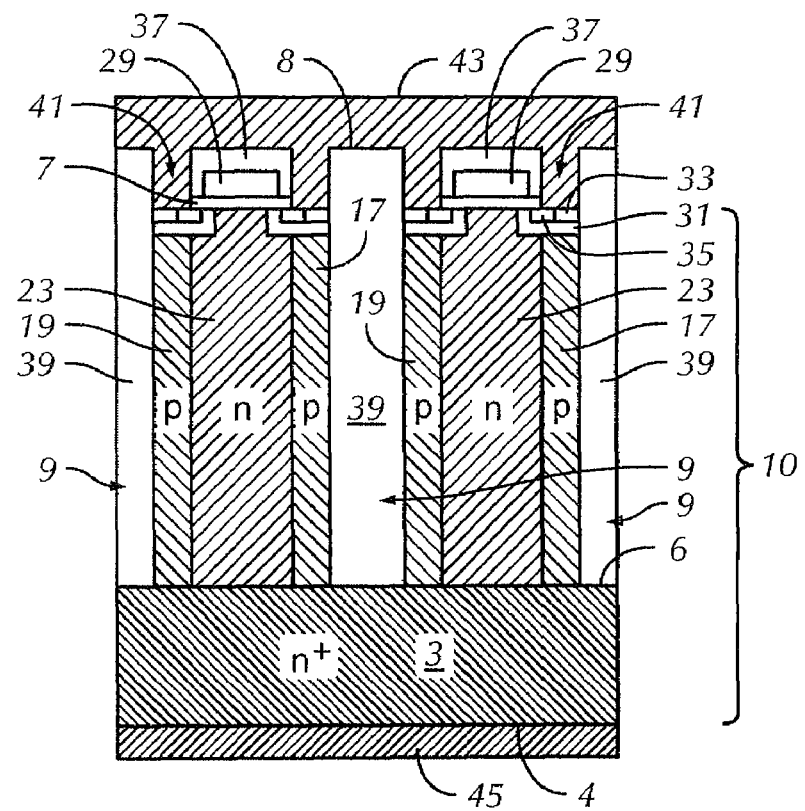
FIG. 6 is an enlarged partial cross-sectional view of the semiconductor substrate after contact hole opening, metal electrode formation, passivation, and backside electrode formation.

FIG. 6 is an enlarged partial cross-sectional view of the semiconductor substrate 10 after contact hole opening, metal electrode formation, passivation, and backside electrode formation. Contact hole openings 41 are formed by removing the ILD deposition 37 and oxide layer 7 at appropriate positions above the three doped regions 31, 33, 35 to expose the entire body contact 35 and the partial source 33 at the first main surface 2. Using methods known in the field, metallization is performed to deposit a layer of metal 43 over the contact hole openings 41 and the top surface 8. Passivation is performed using methods known in the field with an appropriate passivation material such as nitride, oxide, or PSG. A backside or drain electrode 45 is also provided at the second main surface 4.

The process embodiments of the present invention are versatile and the sidewall surfaces 13, 15 of the trenches 9 can be doped with p and/or n columns at desired thickness, both thermally stable and unstable refill materials can be used as the final refill material, the n columns and p columns may be exchanged, etc. The different embodiments can be use to make any trench type semiconductor devices, including, but not limited to, a superjunction MOSFET, a superjunction metal-semiconductor field-effect transistor (MESFET), a superjunction Schottky transistor, a superjunction insulated-gate bipolar transistor (IGBT), a diode, and similar devices.

In another general aspect, embodiments of the present also include a trench type semiconductor device manufactured according to methods described above. In exemplary embodiments of the present invention, the trench type semiconductor device includes a trench filled with a semi-insulating material and/or an insulating material that is thermally unstable at a temperature of about 800° C. and above, but preferably thermally stable at a temperature of about 350° C., about 400° C., about 450° C., about 500° C., about 550° C., about 600° C., about 650° C., about 700° C., or about 750° C. Preferred embodiments include a trench type semiconductor device that includes a trench filled with a semi-insulating material and/or an insulating material that is organic, such as a polyimide or another polymer resin.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

I claim:

1. A method of manufacturing a trench type semiconductor device, the method comprising:
    (i) providing a semiconductor substrate having first and second main surfaces opposite to each other, the semiconductor substrate having a heavily doped region of a first conductivity type at the second main surface and having a lightly doped region of the first conductivity type at the first main surface;
    (ii) forming in the semiconductor substrate a plurality of mesas and a plurality of trenches, each mesa having an adjacent trench and a first extending portion extending from the first main surface toward the heavily doped region to a first depth position, and at least one mesa having a first sidewall surface and a second sidewall surface, each of the plurality of trenches having a bottom;
    (iii) doping, with a dopant of a second conductivity type, the first sidewall surface of the at least one mesa to form a first doped region of the second conductivity type;
    (iv) doping, with a dopant of a second conductivity type, the second sidewall surface of the at least one mesa to form a second doped region of the second conductivity type;
    (v) filling at least a portion of the plurality of trenches adjacent to the first main surface with a disposable material;
    (vi) after filling the at least a portion of the plurality of trenches, forming a terminal structure at the first main surface;
    (vii) after the terminal structure has been formed, removing the disposable material from the plurality of trenches; and
    (viii) filling the plurality of trenches with at least one of a semi-insulating material, an insulating material, and a combination thereof.

2. The method of claim 1, further comprising, prior to the step of filling with the disposable material:
    (a) doping, with a dopant of the first conductivity type, the first sidewall surface of the at least one mesa to form a first doped region of the first conductivity type; and
    (b) doping, with a dopant of the first conductivity type, the second sidewall surface of the at least one mesa to form a second doped region of the first conductivity type.

3. The method of claim 1 further comprising a step of lining the first and the second sidewall surfaces, and the bottom of the trenches with an oxide material, prior to the step of filling with the disposable material.

4. The method of claim 1 further comprising lining the first and the second sidewall surfaces and the bottom of the trenches with a nitride material, prior to the step of filling with the disposable material.

5. The method of claim 1, wherein the plurality of trenches are formed utilizing one or more of etching techniques selected from the group consisting of plasma etching, reactive ion etching (RIE), sputter etching, vapor phase etching, and chemical etching.

6. The method of claim 1, wherein the step of removing the disposable material from the plurality of trenches comprises isotropic etching.

7. The method of claim 1, wherein the trench type semiconductor device is selected from the group consisting of a superjunction metal-oxide-semiconductor field-effect transistor (MOSFET), a superjunction metal-semiconductor field-effect transistor (MESFET), a superjunction Schottky transistor, a superjunction insulated-gate bipolar transistor (IGBT), and a diode.

8. The method of claim 1, wherein the steps (i)-(viii) are performed sequentially.

9. The method of claim 1, wherein prior to commencement of each of the steps (i)-(viii), the respective preceding step is substantially completed.

10. The method of claim 1, wherein prior to commencement of each of the steps (i)-(viii), the respective preceding step is fully completed.

11. The method of claim 1, wherein the at least one of the semi-insulating material and the insulating material is thermally unstable at a temperature of about 800° C. and above.

12. The method of claim 11, wherein the at least one of the semi-insulating material and the insulating material is thermally stable at a temperature selected from the group consisting of about 350° C., about 400° C., about 450° C., about 500° C., about 550° C., about 600° C., about 650° C., about 700° C., and about 750° C.

13. The method of claim 1, wherein the at least one of the semi-insulating material and the insulating material is an organic material.

14. The method of claim 13, wherein the semi-insulating material or the insulating material comprises polyimide.

15. The method of claim 1, wherein the disposable material is thermally stable at a temperature of about 800° C. and above.

16. The method of claim 15, wherein the disposable material is selected from the group consisting of silicon oxide, silicon nitride, tetraethylorthosilicate (TEOS), and a polysilicon.

17. The method of claim 1, wherein the step of forming a terminal structure comprises:
    (a) forming a gate electrode over the first main surface with a gate insulation layer interposed therebetween;
    (b) forming a third doped region of the second conductivity type at the first main surface side of the first doped region of a first trench, to be electrically connected to the first doped region of the first trench; and
    (c) forming a fourth doped region of the second conductivity type at the first main surface side of the second doped region of a second trench, to be electrically connected to the second doped region of the second trench, wherein the gate electrode is located between the third and fourth doped regions.

18. The method of claim 17, wherein the gate insulation layer is formed on the first main surface.

19. The method of claim 1 further comprising smoothing the first and second sidewall surfaces prior to the steps of doping.

20. The method of claim 19, wherein the step of smoothing comprises sacrificial oxidation of the first and second sidewall surfaces.

* * * * *